(12) United States Patent
Lee et al.

(10) Patent No.: US 10,644,034 B2
(45) Date of Patent: May 5, 2020

(54) ARRAY SUBSTRATE OF DISPLAY PANEL (71) Applicant: INNOLUX CORPORATION, Chu-Nan, Miao-Li County (TW)

(72) Inventors: I-Che Lee, Chu-Nan (TW); Ying-Tong Lin, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 15/643,439

(22) Filed: Jul. 6, 2017

(65) Prior Publication Data
US 2017/0309648 A1 Oct. 26, 2017

Related U.S. Application Data

(63) Continuation of application No. 14/529,099, filed on Oct. 30, 2014, now Pat. No. 9,728,554.

(30) Foreign Application Priority Data

Aug. 22, 2014 (TW) .............................. 103128987 A (51) Int. Cl.
*H01L 27/12* (2006.01)
*H01L 29/423* (2006.01)
*H01L 29/786* (2006.01)

(52) U.S. Cl.
CPC .... *H01L 27/1222* (2013.01); *H01L 29/42372* (2013.01); *H01L 29/42384* (2013.01); *H01L 29/78696* (2013.01)

(58) Field of Classification Search
CPC ........... G02F 1/134309; H01L 27/1222; H01L 27/127
See application file for complete search history.

(56) References Cited

U.S. PATENT DOCUMENTS 6,664,145 B1 * 12/2003 Yamazaki ......... H01L 29/42384
257/E27.111
2002/0039813 A1 * 4/2002 Yamazaki ......... H01L 29/66757
438/151

(Continued)

FOREIGN PATENT DOCUMENTS

CN     101194276    6/2008
JP     2007201437   8/2007

(Continued)

OTHER PUBLICATIONS

Foreign Office Action issued by the Korean Intellectual Property Office, dated Apr. 17, 2016.

(Continued)

*Primary Examiner* — Wael M Fahmy
*Assistant Examiner* — Sarah K Salerno
(74) *Attorney, Agent, or Firm* — Liu & Liu (57) ABSTRACT

An array substrate of display panel comprises a substrate, a first and second transistors disposed on the substrate. The first and second transistors are electrically connected and share a semiconducting layer which comprises a first lateral portion, a turning portion and a bottom portion. The turning portion connects to the first lateral portion. The bottom portion connects to the turning portion. In one embodiment, a first outer edge extending line of the first lateral portion, a second outer edge extending line of the bottom portion and a third outer edge of the turning portion defines a first region. A first inner edge extending line of the first lateral portion, a second inner edge extending line of the bottom portion and a third inner edge of the turning portion defines a second region. The area of the first region is smaller than that of the second region.

17 Claims, 5 Drawing Sheets

(56) References Cited

U.S. PATENT DOCUMENTS

| | | |
|---|---|---|
| 2007/0147151 A1 | 6/2007 | Kurokawa |
| 2009/0085638 A1 | 4/2009 | Shionoiri et al. |
| 2012/0319237 A1 | 12/2012 | Cooney, III et al. |
| 2014/0332761 A1* | 11/2014 | Kim .................. H01L 27/3262 257/40 |
| 2016/0012775 A1* | 1/2016 | Jeong ................ H01L 27/1222 345/690 |

FOREIGN PATENT DOCUMENTS

| | | |
|---|---|---|
| KR | 20070069072 | 7/2007 |
| TW | 200415427 | 8/2004 |

OTHER PUBLICATIONS

Foreign Office Action issued by the Taiwan Intellectual Property Office, dated May 18, 2015.

* cited by examiner

ARRAY SUBSTRATE OF DISPLAY PANEL

This is a continuation of application Ser. No. 14/529,099, filed on Oct. 30, 2014 (now allowed) and entitled "ARRAY SUBSTRATE OF DISPLAY PANEL", which claims the benefit of Taiwan patent application serial number 103128987, filed Aug. 22, 2014, the contents of which are incorporated herein by reference.

BACKGROUND

Field of the Invention

The disclosure relates in general to an array substrate of a display panel, and more particularly to an array substrate having a semiconducting layer with different curvatures of the inner and outer edges.

Description of the Related Art

Today, electronic products with displays, such as smart phones, tablet personal computers (i.e. tablet PC, flat PC, ex: iPad), laptops, monitors, and televisions, are necessary tools for work and leisure in the daily life. Liquid crystal display (LCD) is the most popular displays in use. Being compact in size, light in weight, power-saving and radiation-free, LCDs are the most popular displays in use. LCD is a flat panel display, electronic visual display, or video display that uses the light modulating properties of liquid crystals. LCD possesses the excellent characteristics such as compact in size, light weight, easy to carry, having reasonable price, higher display quality and operation reliability. Also, viewer's eyes feel much more comfortable looking at a LCD. Older cathode ray tube (CRT) monitors are being replaced by LCD. Currently, LCDs provide a versatile choice in sizes, shapes and resolutions for the consumer.

Currently, the liquid crystal displays (LCD) can be divided into amorphous silicon thin film transistor (a-Si TFT)-LCDs and low temperature poly Si thin film transistor (LTPS TFT)-LCDs. The carrier mobility within transistor in LTPS TFT-LCD is 100 times (>100 cm2/V·s) higher than that in a-Si TFT-LCD. Also, LTPS allows the CMOS process to be directly performed on the glass substrate. Compared to a-Si TFT-LCD, LTPS TFT-LCD has the advantages of quick response, high brightness, high aperture ratio, high resolution and low power consumption. Also, the LTPS TFT has high-density layout characteristic. Those features of the LTPS TFT are suitable for the applications of organic light emitting display (OLED) panels, and an OLED display panel with high brightness and high display quality can be easier achieved, and the lifetime of OLED can be extended.

The important factors for manufacturing a qualified display panel includes not only the details in procedures such as accurate patterning steps (ex: lithography and etch) without breaking metal layers (ex: conductive traces) and the semiconducting layers, but also the electrical performances such as the resistance, capacitance meeting the requirements of the product, thereby producing the display panel with good reliability. The faulty design of the display panel will lead to the decreases of the yield and reliability of production.

SUMMARY

The disclosure is directed to an array substrate of a display panel by forming a semiconducting layer with the particularly designed turning portion to decrease the resistance, thereby improving the electrical characteristics and the reliability of the display panel applied with the embodied array substrate.

According to one embodiment of the disclosure, an array substrate is provided, comprising a substrate, a first transistor disposed on the substrate, and a second transistor disposed on the substrate. The first transistor and the second transistor are electrically connected and share a semiconducting layer. The semiconducting layer at least comprises a first lateral portion, a turning portion connecting to the first lateral portion, and a bottom portion connecting to the turning portion. Also, a first outer edge extending line of the first lateral portion, a second outer edge extending line of the bottom portion and a third outer edge of the turning portion defines a first region, and a first inner edge extending line of the first lateral portion, a second inner edge extending line of the bottom portion and a third inner edge of the turning portion defines a second region, wherein an area of the first region is smaller than an area of the second region.

According to one embodiment of the disclosure, an array substrate is provided, comprising a substrate, a first transistor disposed on the substrate, and a second transistor disposed on the substrate. The first transistor and the second transistor are electrically connected and share a semiconducting layer. The semiconducting layer at least comprises a first lateral portion, a turning portion connecting to the first lateral portion, and a bottom portion connecting to the turning portion. Also, a third outer edge of the turning portion has a first curvature r1, a third inner edge of the turning portion has a second curvature r2, wherein the first curvature r1 is larger than the second curvature r2.

The above and other aspects of the disclosure will become better understood with regard to the following detailed description of the preferred but non-limiting embodiments. The following description is made with reference to the accompanying drawings.

DETAILED DESCRIPTION

In the embodiment of the present disclosure, an array substrate of a display panel is provided by forming a semiconducting layer with the particularly designed turning portion, thereby decreasing the resistance of the turning portion, and reducing resistance differences between the turning portion and the non-turning portion (linear portion). According to the disclosure, a semiconducting layer with uniform resistance can be obtained, and the display panel applied with the array substrate having the semiconducting layer of the embodiment can possess good electrical characteristics, thereby improving the reliability and the electrical performance of the display panel. Moreover, due to the particularly designed turning portion, the semiconducting layer of the embodiment would not be over-etched and broken easily after patterning procedure, thereby increasing the yield of production.

The embodiment of the present disclosure can be applied to an array substrate of a display panel, such as (but not limited to) an array substrate (thin-film-transistor substrate) of a low temperature polysilicon (LTPS) display panel.

The embodiments are described in details with reference to the accompanying drawings. It is noted that the details of the structures of the embodiments are provided for exemplification, and the described details of the embodiments are not intended to limit the present disclosure. The identical and/or similar elements of the embodiments are designated with the same and/or similar reference numerals. It is noted that not all embodiments of the invention are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
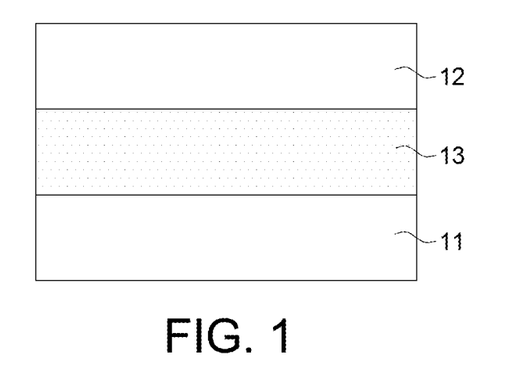
FIG. 1 illustrates a display panel according to an embodiment of the disclosure.
Figure 2:
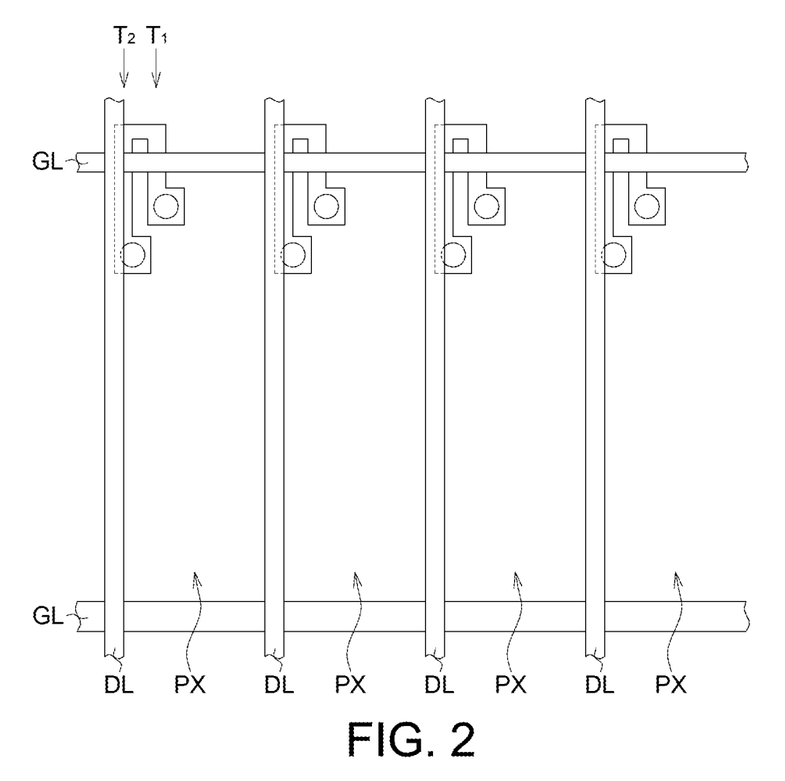
FIG. 2 is a top view of an array substrate of a display panel according to an embodiment of the disclosure.

FIG. 1 illustrates a display panel according to an embodiment of the disclosure. A display panel comprises a first substrate 11, a second substrate 12, and a display medium layer 13 disposed between the first substrate 11 and the second substrate 12. The first substrate 11 and the second substrate 12 can be a TFT substrate and a CF substrate, respectively. FIG. 2 is a top view of an array substrate of a display panel according to an embodiment of the disclosure. In FIG. 2, the array substrate has a plurality of gate lines GL and data lines DL intersecting to define pixels. Two adjacent gate lines GL and two adjacent data lines DL define one pixel PX. In one embodiment, each pixel has a first transistor T1 and a second transistor T2, and at least a drain D of one of the first transistor T1 and the second transistor T2 is coupled to the data line DL.

In order to reveal and describe the related elements of the embodiment, the accompanying drawings depict related elements from bottom views of an array substrate (such as TFT substrate) of the display panel.

Figure 3:
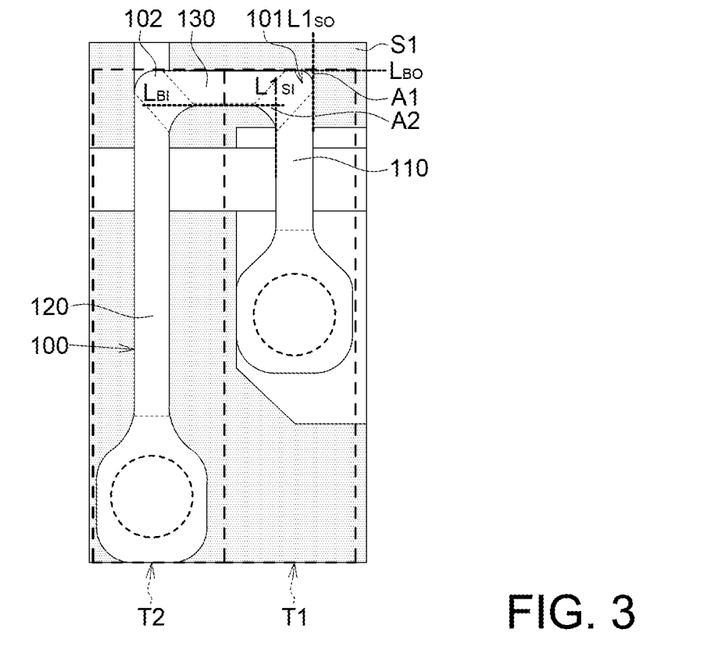
FIG. 3 illustrates a bottom view of parts of the array substrate of a display panel according to an embodiment of the disclosure.

FIG. 3 illustrates a bottom view of parts of the array substrate of a display panel according to an embodiment of the disclosure. The array substrate of the display panel of the embodiment can be a TFT substrate. In the embodiment, an array substrate comprises a substrate S1, a first transistor T1 and a second transistor T2 disposed on the substrate in series connection. The first transistor T1 and the second transistor T2 are electrically connected. Also, the first transistor T1 and the second transistor T2 share a semiconducting layer 100. In one embodiment, the semiconducting layer 100 is a polysilicon layer.

Relative positions of the first transistor T1 and the second transistor T2 can be optionally altered according to the requirements of circuit design in the practical applications. The pattern of the semiconducting layer 100 for connecting to the first transistor T1 and the second transistor T2 can be determined according to the positions of the first transistor T1 and the second transistor T2. For example, the semiconducting layer 100 can be in a form of L-shape or the like, or in a form of U-shape as shown in FIG. 3 or the like. The semiconducting layer 100 can be configured into other shape, as long as it accomplishes the connection between the first transistor T1 and the second transistor T2. According to the embodiment of the present disclosure, the semiconducting layer 100 with the turning portion is designed specifically to lower the resistance of the turning portion, thereby reducing resistance differences between the turning portion and the linear portion. Accordingly, the resistances of different sections of the semiconducting layer 100 can be closer, and the semiconducting layer 100 with uniform resistance is obtained.

Figure 4A:
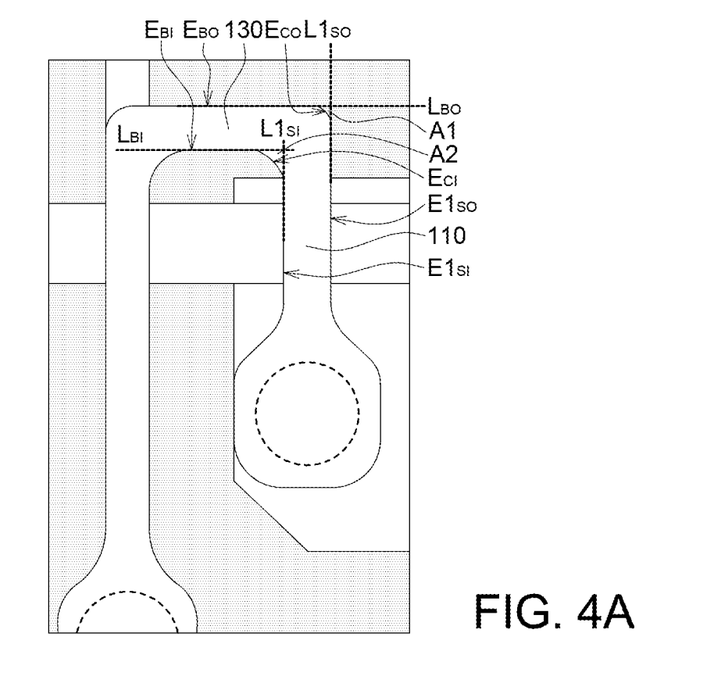
FIG. 4A is an enlarging view of the first transistor of FIG. 3, which labels the denotations of the related edges of the first lateral portion and turning portion.

In one embodiment, the semiconducting layer 100 at least includes a first lateral portion 110 extended from the first transistor T1 or the second transistor T2, a turning portion 101 connecting to the first lateral portion 110, and a bottom portion 130 connecting to the turning portion 101. FIG. 4A is an enlarging view of the first transistor of FIG. 3, which labels the denotations of the related edges of the first lateral portion 110 and turning portion 101. Please refer to FIG. 3 and FIG. 4A simultaneously.

According to the embodiment, a first outer edge extending line $L1_{SO}$ of the first lateral portion 110, a second outer edge extending line $L_{BO}$ of the bottom portion 130 and a third outer edge $E_{CO}$ of the turning portion 101 defines a first region A1. A first inner edge extending line $L1_{SI}$ of the first lateral portion 110, a second inner edge extending line $L_{BI}$ of the bottom portion 130 and a third inner edge $E_{CI}$ of the turning portion 101 defines a second region A2, as shown in FIG. 4A. In the embodiment, an area of the first region A1 is smaller than an area of the second region A2.

In one embodiment, a ratio of the area of the first region A1 to the area of the second region A2 is in a range of about 0.2 to about 0.7.

Moreover, according to the embodiment, the third inner edge $E_{CI}$ of the turning portion 101 is substantially non-parallel to the first inner edge $E1_{SI}$ of the first lateral portion 110 and also non-parallel to the second inner edge $E_{BI}$ of the bottom portion 130. The third outer edge ECO of the turning portion 101 is substantially non-parallel to the first outer edge $E1_{SO}$ of the first lateral portion 110 and also non-parallel to the second outer edge $E_{BO}$ of the bottom portion 130.

In one embodiment, the first lateral portion 110 is substantially perpendicular to the bottom portion 130. As shown in FIG. 3, the second inner edge $E_{BI}$ of the bottom portion 130 is substantially perpendicular to the first inner edge $E1_{SI}$ of the first lateral portion 110, and the second outer edge $E_{BO}$ of the bottom portion 130 is substantially perpendicular to the first outer edge $E1_{SO}$ of the first lateral portion 110. Although configuration of the first lateral portion 110 and the bottom portion 130 presents an L-shape substantially, the disclosure is not limited thereto. The first lateral portion 110 and the bottom portion 130 can be arranged by varying an angle therebetween larger or smaller than 90 degrees. Configuration of the first lateral portion 110 and the bottom portion 130 can be optionally modified and altered depending on the positions of the first transistor T1 and the second transistor T2 and the setting condition of the semiconducting layer 100 in the practical applications.

Additionally, the semiconducting layer 100 of the embodiment as shown in FIG. 3 further comprises a second lateral portion 120, and the bottom portion 130 is positioned between the first lateral portion 110 and the second lateral portion 120. One end of the bottom portion 130 is connected to the turning portion 101, and the other end of the bottom portion 130 is connected to the second lateral portion 120 by the other turning portion 102.

Figure 4B:
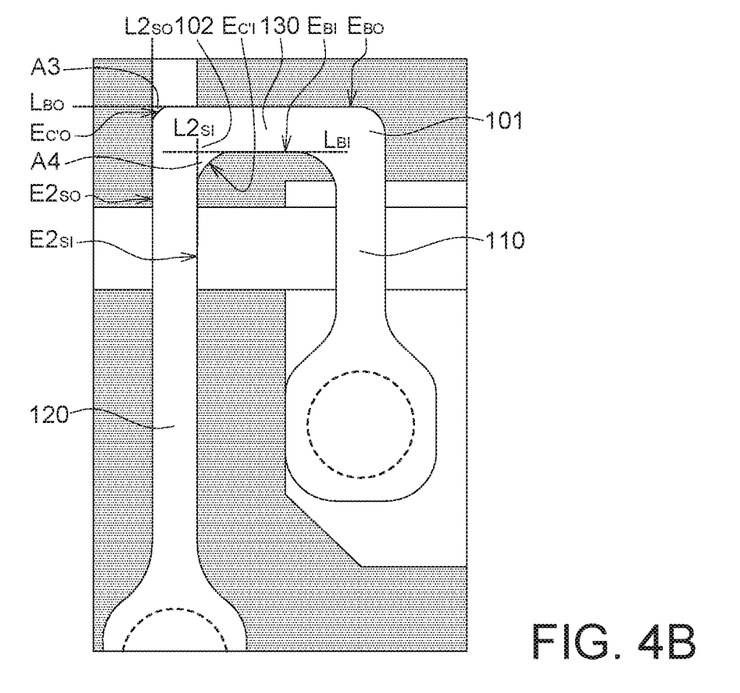
FIG. 4B is an enlarging view of the first transistor of FIG. 3, which labels the denotations of the related edges of the second lateral portion and the turning portion.

FIG. 4B is an enlarging view of the first transistor of FIG. 3, which labels the denotations of the related edges of the second lateral portion 120 and the turning portion 102. Please refer to FIG. 3 and FIG. 4B simultaneously. Two ends of the turning portion 102 connect to the second lateral portion 120 and the bottom portion 130, respectively. In FIG. 3, the semiconducting layer 100, comprising the first lateral portion 110, the bottom portion 130 and the second lateral portion 120, is substantially, but not limitedly, in a form of U-shape. As shown in FIG. 4B, the second lateral portion 120 is substantially parallel to the first lateral portion 110. Accordingly, a fourth inner edge $E2_{SI}$ of the second lateral portion 120 is substantially parallel to the first inner edge $E1_{SI}$ of the first lateral portion 110, and a fourth outer edge $E2_{SO}$ of the second lateral portion 120 is substantially parallel to the first outer edge $E1_{SO}$ of the first lateral portion 110.

Also, the second lateral portion 120 is substantially perpendicular to the bottom portion 130. A second inner edge $E_{BI}$ of the bottom portion 130 is substantially perpendicular to the fourth inner edge $E2_{SI}$ of the second lateral portion 120, and a second outer edge $E_{BO}$ of the bottom portion 130 is substantially perpendicular to the fourth outer edge $E2_{SO}$ of the second lateral portion 120.

Similarly, a fourth outer edge extending line $L2_{SO}$ of the second lateral portion 120, a second outer edge extending line $L_{BO}$ of the bottom portion 130 and a third outer edge $E_{C'O}$ of the turning portion 102 defines a third region A3. A fourth inner edge extending line $L2_{SI}$ of the second lateral portion 120, a second inner edge extending line $L_{BI}$ of the bottom portion 130 and a third inner edge $E_{C'I}$ of the turning portion 102 defines a fourth region A4, as shown in FIG. 4B. In the embodiment, an area of the third region A3 is smaller than an area of the fourth region A4.

In one embodiment, a ratio (A3/A4) of the area of the third region A3 to the area of the fourth region A4 is in a range of about 0.2 to about 0.7. Also, the area of the first region A1 can be equal to or not equal to the area of the third region A3, and the area of the second region A2 can be equal to or not equal to the area of the fourth region A4.

Figure 5:
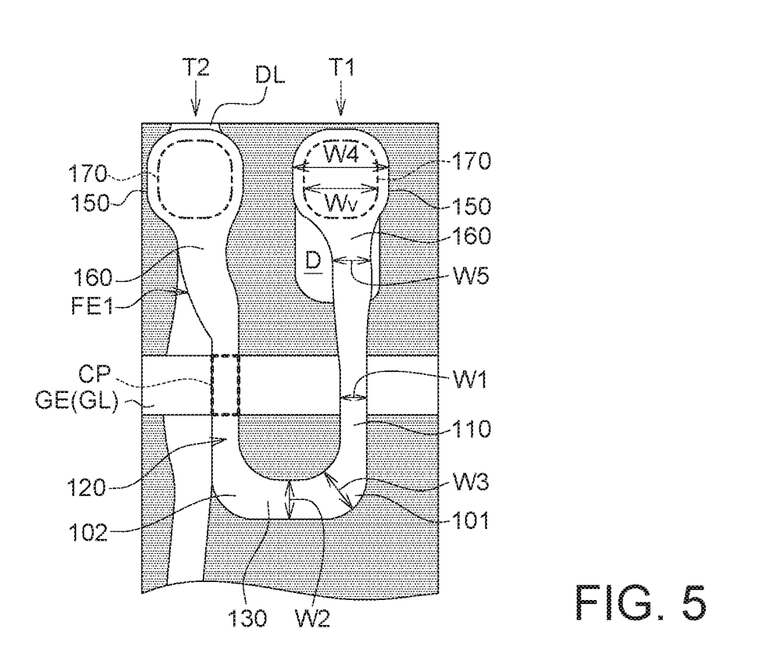
FIG. 5 illustrates a bottom view of another part of the array substrate of a display panel according to the first embodiment of the disclosure.

FIG. 5 illustrates a bottom view of another part of the array substrate of a display panel according to the first embodiment of the disclosure. The identical elements of FIG. 5 and FIG. 3 are designated with the same reference numerals. According to a LTPS display panel applied with an array substrate of the embodiment, the first transistor T1 has a gate electrode GE, the first lateral portion 110 on the gate electrode GE has a first width W1, and the bottom portion 130 has a second width W2. In one embodiment, the first width W1 is smaller than the second width W2 (W1<W2). It is noted that the applicable embodiment is not limited to the configuration depicted in FIG. 5. In other embodiment, the first width W1 can be larger than the second width W2 (W1>W2). In one embodiment, the turning portion 101 has a third width W3, and the third width W3 is larger than (the first width $W1^2$+the second width $W2^2)^{0.5}$ (W3>$\sqrt{W1^2+W2^2}$).

Moreover, the semiconducting layer 100 comprises an enlarging portion 150, and the enlarging portion 150 has a fourth width W4, as shown in FIG. 5. In one embodiment, the enlarging portion 150 corresponds to the drain D of the first transistor T1. The semiconducting layer 100 has a joint portion 160 positioned between the first lateral portion 110 and the enlarging portion 150, and the joint portion 160 has a fifth width W5. In one embodiment, the fifth width W5 is larger than the first width W1 (W5>W1), and the fifth width W5 is smaller than the fourth width W4 (W5<W4). As shown in FIG. 5, the semiconducting layer 100 has a channel portion CP overlapping with the gate line GL, the joint portion 160 is between the enlarging portion 150 and the channel portion CP. Also, at least a part of the enlarging portion 150 and at least a part of the joint portion 160 are overlapping with the data line DL, the joint portion has a first edge FE1, the first edge FE1 is overlapping with the data line DL, and at least a part of the first edge FE1 is curved.

In one embodiment, a second metal layer can be electrically connected to the enlarging portion 150 of the semiconducting layer 100 through a via 170. The via 170 may reveal an upper surface of the enlarging portion 150, or penetrate through the enlarging portion 150. As shown in FIG. 5, the via 170 has a width Wv, and the width Wv is smaller than the fourth width W4 of the enlarging portion 150 (Wv<W4).

Figure 6:
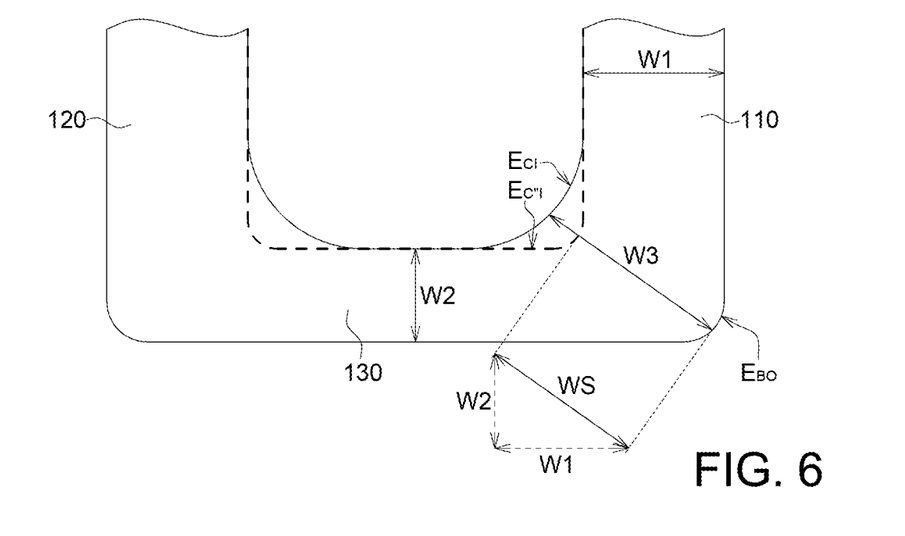
FIG. 6 is a simple drawing of a semiconducting layer of a transistor.

FIG. 6 is a simple drawing of a semiconducting layer of a transistor. As described above, the first lateral portion 110 of the first transistor T1 has a first width W1, and the bottom portion 130 has a second width W2. If a triangle having two sides of the first width W1 and the second width W2 is drawn, the longest side Ws is equal to (the first width $W1^2$+the second width $W2^2)^{0.5}$ (Ws=$\sqrt{W1^2+W2^2}$). In one embodiment, the third width W3 of the turning portion 101 is larger than (the first width $W1^2$+the second width $W2^2)^{0.5}$ (W3>$\sqrt{W1^2+W2^2}$). According to the embodiment, the third outer edge $E_{CO}$ of the turning portion 101 is less curving, while the third inner edge $E_{CI}$ of the turning portion 101 is more curving. When a voltage is applied to the display panel, the current tends to flow along the shortest path (i.e. the inner edge). Since the length of the third inner edge $E_{CI}$ (more curving) of the turning portion 101 is shorter than the inner edge $E_{C''I}$ (i.e. the corner drawn by dashed lines, which is less curving), the embodied turning portion 101 having the third inner edge $E_{CI}$ does efficiently decrease the resistance. Also, the resistance of the turning portion 101 is typically larger than the resistance of the linear portions (such as the first lateral portion 110 and the second lateral portion 120). The width of the embodied turning portion 101 (with more curving inner edge and less-curving outer edge) is larger than the width of the conventional turning portion (with less-curving inner and outer edges), so that the resistance of the embodied turning portion is lower than the resistance of the conventional turning portion. Accordingly, the resistance differences between the embodied turning portion and the linear portion portions (such as the first lateral portion 110 and the second lateral portion 120) can be reduced, thereby obtaining a semiconducting layer 100 with more uniform resistances of different sections. Thus, the display panel applied with the array substrate having the semiconducting layer 100 of the embodiment can possess improved electrical characteristics and good reliability. Additionally, a mask for fabricating the semiconducting layer 100 of the embodiment is designed according to the pattern of the semiconducting layer 100 correspondingly. After fabricating through the mask lithography and etching, the semiconducting layer 100 of the embodiment is formed, particularly the semiconducting layer 100 having the embodied turning portion 101 with the more curving inner edge and the less-curving outer edge.

Figure 7:
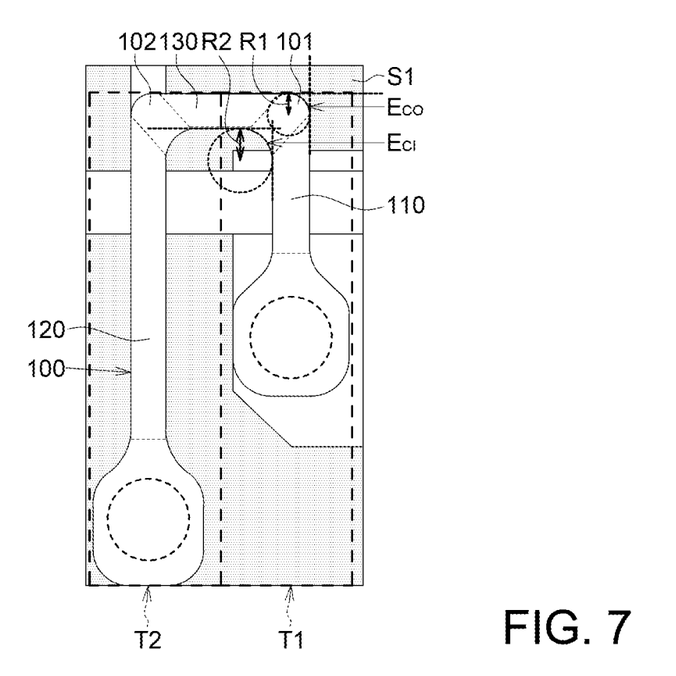
FIG. 7 illustrates a bottom view of a part of an array substrate of a display panel according to the second embodiment of the disclosure.

FIG. 7 illustrates a bottom view of a part of an array substrate of a display panel according to the second embodiment of the disclosure. The array substrate of the display panel of the embodiment can be a TFT substrate. The identical elements of FIG. 7 and FIG. 3 are designated with the same reference numerals. Also, it is known that the semiconducting layer 100 is not limited to the U-shaped configuration as depicted in the accompany drawings. The pattern of the semiconducting layer 100 for connecting to the first transistor T1 and the second transistor T2 can be adjusted and altered according to the conditions of the practical applications. The disclosure can be applied to various types of the semiconducting layers having turning portions.

In the second embodiment, an array substrate similarly comprises a substrate S1, a first transistor T1 and a second transistor T2 disposed on the substrate S1 in series connection. The first transistor T1 and the second transistor T2 are electrically connected and share a semiconducting layer 100 (such as a polysilicon layer). Similarly, the semiconducting layer 100 at least includes a first lateral portion 110 extended from the first transistor T1 or the second transistor T2, a turning portion 101 connecting to the first lateral portion 110, and a bottom portion 130 connecting to the turning portion 101.

The first embodiment is related to the design of the inner and outer edges of the turning portion 101 connecting to the first lateral portion 110, so as to form the first region A1 (defined by the outer edges) having the area smaller than the second region A2 (defined by the inner edges). The second embodiment is related to the curvature design of the inner and outer edges of the turning portion 101. Accordingly, the semiconducting layer of the second embodiment has the embodied turning portion 101 with the more curving inner edge and the less-curving outer edge, so as to achieve the result of resistance decrease.

As shown in FIG. 7, the third outer edge $E_{CO}$ of the turning portion 101 has a first curvature r1 (i.e. the reciprocal of the first radius of curvature R1, 1/R1), the third inner edge $E_{CI}$ of the turning portion 101 has a second curvature r2 (i.e. the reciprocal of the second radius of curvature R2, 1/R2). In the second embodiment, the first curvature r1 is larger than the second curvature r2, which means the first radius of curvature R1 is smaller than the second radius of curvature R2 (R1<R2). In one embodiment, a ratio of the first curvature r1 to the second curvature r2 (r1/r2) is in a range of about 1.1 to about 2.

In the practical applications, many different ways can be applied for measuring and obtaining the first curvature r1 and the second curvature r2 of the turning portion 101. One of applicable measurements is described below. Please refer to FIG. 8, which shows how to measure the curvatures of the inner and outer edges of the turning portion of FIG. 7.

Figure 8:
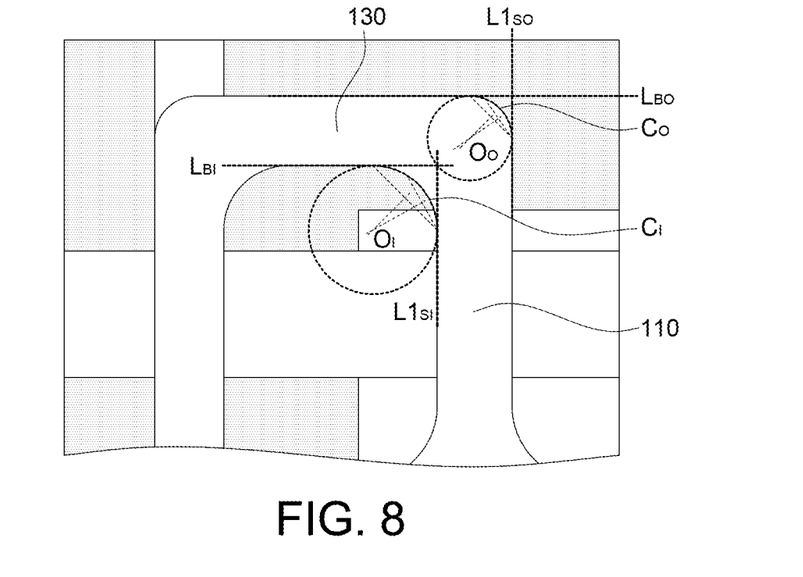
FIG. 8 shows how to measure the curvatures of the inner and outer edges of the turning portion of FIG. 7.

First, the extending lines along the first lateral portion 110, such as the first outer edge extending line $L1_{SO}$ and the first inner edge extending line $L1_{SI}$, are drawn. The extending lines along the bottom portion 130, such as the second outer edge extending line $L_{BO}$ and the second inner edge extending line $L_{BI}$, are drawn.

Then, an outer arc $C_O$ can be determined according to a nearest contact point of the first outer edge extending line $L1_{SO}$ of the first lateral portion 110 and the turning portion 101 and a nearest contact point of the second outer edge extending line $L_{BO}$ of the bottom portion 130 and the turning portion 101. Similarly, an inner arc $C_I$ can be determined according to a nearest contact point of the first inner edge extending line $L1_{SI}$ of the first lateral portion 110 and the turning portion 101 and a nearest contact point of the second inner edge extending line $L_{BI}$ of the bottom portion 130 and the turning portion 101.

Next, the perpendicular bisectors of any two chords are drawn, and the intersection of these two perpendicular bisectors is the center of the arc. As shown in FIG. 8, the center $O_O$ of the outer arc $C_O$ and the center $O_I$ of the inner arc $C_I$ are found. The distance between the center and the point of tangency is the radius of curvature. FIG. 8 depicts the first radius of curvature R1 and the second radius of curvature R2. Finding the radius of curvature R means finding the curvature r. The reciprocal of the radius of curvature R is the curvature r.

According to the aforementioned descriptions, an array substrate of a display panel is provided by forming a semiconducting layer with the particularly designed turning portion. In the embodiment, the inner and outer edges (i.e. the third outer edge $E_{CO}$ and the third inner edge $E_{CI}$) of the turning portion 101 of the semiconducting layer 100 have different curving conditions. As described in the embodiments above, the turning portion 101 can be designed to form the first region A1 (defined by the outer edges) having the area smaller than the second region A2 (defined by the inner edges) (A2>A1) as described in the first embodiment, thereby decreasing the resistance of the turning portion. Alternatively, the turning portion 101 can be designed to form the embodied turning portion 101 with the more curving third inner edge $E_{CI}$ (i.e. smaller curvature r2) and the less-curving third outer edge $E_{CO}$ (i.e. larger curvature r1) as described in the second embodiment, thereby decreasing the resistance of the turning portion. Also, the resistance of the turning portion 101 is typically larger than the resistance of the linear portions (such as the first lateral portion 110 and the second lateral portion 120). The width of the embodied turning portion 101 (with more curving inner edge and less-curving outer edge) is larger than the width of the conventional turning portion (with less-curving inner and outer edges), so that the resistance of the embodied turning portion is lower than the resistance of the conventional turning portion. Accordingly, the resistance differences between the embodied turning portion and the linear portion portions (such as the first lateral portion 110 and the second lateral portion 120) can be reduced, thereby obtaining a semiconducting layer 100 with more uniform resistances of different sections. Thus, the display panel applied with the array substrate having the semiconducting layer 100 of the embodiment can possess improved electrical characteristics and good reliability. Moreover, due to the particularly designed turning portion, the semiconducting layer of the embodiment would not be over-etched and broken easily after patterning procedure, thereby increasing the yield of production.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
   a substrate;
   a gate line disposed on the substrate and extending along a first direction;
   a data line disposed on the substrate and intersecting with the gate line, wherein the gate line and the data line are different layers;
   a semiconducting layer disposed on the substrate, wherein the semiconducting layer has an enlarging portion, a joint portion, a channel portion and a turning portion,
   wherein the enlarging portion is electrically connected to the data line through a first via, the channel portion is overlapping with the gate line, the joint portion is between the enlarging portion and the channel portion, the channel portion is between the joint portion and the turning portion, the semiconducting layer is electrically connected to a drain by a second via, and a distance between the first via and the gate line is greater than a distance between the second via and the gate line in a direction perpendicular to the first direction, and
   wherein the channel portion is disposed in a pixel, and at least a part of the enlarging portion and at least a part of the joint portion are overlapping with the data line.

2. The display according to claim 1, wherein the data line has an overlapping region overlapping with the gate line, and at least a part of the overlapping region is overlapping with the channel portion.

3. The display according to claim 2, wherein, in the first direction, a width of the first via is greater than a width of the overlapping region.

4. The display according to claim 2, wherein in the first direction, a width of the second via is greater than a width of the overlapping region.

5. The display according to claim 2, wherein the data line further comprise a connecting region and an intermediate region, the connecting region is overlapping with the enlarging portion, and the intermediate region is between the connecting region and the overlapping region, wherein the intermediate region is partially overlapping with the joint portion.

6. The display according to claim 5, wherein the joint portion has a first edge, and at least a part of the first edge is curved.

7. The display according to claim 6, wherein the data line has a second edge, and the first edge is not perpendicular to the second edge.

8. The display according to claim 1, wherein in the first direction, a width of the enlarging portion is greater than a width of a portion of the data line overlapping with the enlarging portion.

9. The display according to claim 1, wherein the semiconducting layer is in a form of L-shape or U-shape.

10. The display according to claim 1, wherein the semiconducting layer further comprises another channel portion overlapping with the gate line, wherein in a top view direction, a shortest distance between the first via and the channel portion is greater than a shortest distance between the second via and the another channel portion, and at least part of the channel portion overlaps the data line.

11. The display according to claim 1, wherein the drain and the semiconducting layer are different layers.

12. A display, comprising:
    a substrate;
    a gate line disposed on the substrate and extending along a first direction;
    a data line disposed on the substrate and intersecting with the gate line;
    a semiconducting layer disposed on the substrate, wherein the semiconducting layer has a first channel portion overlapping with the gate line and a second channel portion overlapping with the gate line,
    wherein the semiconducting layer contacts with the data line through a first via, the semiconducting layer is electrically connected to a drain by a second via,
    wherein in a top view direction, a shortest distance between the first via and the first channel portion is greater than a shortest distance between the second via and the second channel portion, and at least part of the first channel portion overlaps the data line, and
    wherein a width of the first via in the first direction is greater than a width of the first channel portion in the first direction.

13. The display according to claim 12, wherein the drain and the semiconducting layer are different layers.

14. The display according to claim 12, wherein the gate line and the data line are different layers.

15. A display, comprising:
    a first substrate;
    a second substrate;
    a display layer disposed between the first substrate and the second substrate;
    a first transistor disposed on the first substrate; and
    a second transistor disposed on the first substrate, the first transistor and the second transistor being electrically connected and sharing a semiconducting layer, and the semiconducting layer comprising:
    a first lateral portion;
    a turning portion, connecting to the first lateral portion; and
    a bottom portion, connecting to the turning portion,
    wherein an outer edge on a convex side of the turning portion has a first curvature, an inner edge on a concave side of the turning portion has a second curvature, wherein the outer edge and the inner edge have a same turning direction, and the first curvature is larger than the second curvature.

16. The display according to claim 15, wherein the gate line and the data line are different layers.

17. The display according to claim 15, wherein the drain and the semiconducting layer are different layers.

* * * * *